(12) United States Patent
Mosholder

(10) Patent No.: US 11,522,311 B1
(45) Date of Patent: Dec. 6, 2022

(54) TAMPER EVIDENT PORT PROTECTOR

(71) Applicant: The Government of the United States as represented by the Director, National Security Agency, Ft. George G. Meade, MD (US)

(72) Inventor: Gary S. Mosholder, Sykesville, MD (US)

(73) Assignee: Government of the United States as represented by the National Security Agency

( * ) Notice: Subject to any disclaimer, the term of this patent is extended or adjusted under 35 U.S.C. 154(b) by 0 days.

(21) Appl. No.: 17/460,711

(22) Filed: Aug. 30, 2021

(51) Int. Cl.
*H01R 13/443* (2006.01)

(52) U.S. Cl.
CPC .................. *H01R 13/443* (2013.01)

(58) Field of Classification Search
CPC ................... H01R 13/443; H01R 13/6397
USPC ........................................ 439/133, 134, 148
See application file for complete search history.

(56) References Cited

U.S. PATENT DOCUMENTS

| | | | |
|---|---|---|---|
| 5,642,805 A | 7/1997 | Tefft | |
| 6,796,152 B1 | 9/2004 | Yu | |
| 6,802,723 B2 | 10/2004 | Decime et al. | |
| 6,991,479 B2 | 1/2006 | Miao | |
| 7,083,438 B2 | 8/2006 | Massaro et al. | |
| 7,128,586 B2 | 10/2006 | Kung | |
| 7,160,137 B1 | 1/2007 | Yeh | |
| 7,223,574 B2 | 5/2007 | Lei et al. | |
| 7,275,941 B1 | 10/2007 | Bushby | |
| 7,390,201 B1 | 6/2008 | Quinby et al. | |
| 7,428,834 B1 | 9/2008 | Lee | |
| 7,462,045 B1 | 12/2008 | Lee | |
| 7,479,021 B2 | 1/2009 | Huang | |
| 7,530,824 B2 | 5/2009 | Bolain | |
| 7,563,113 B2 | 7/2009 | Sheng | |
| 7,581,417 B1 | 9/2009 | Chen | |
| 7,635,272 B2 | 12/2009 | Poppe | |
| 7,677,065 B1 | 3/2010 | Miao | |
| 7,722,369 B2 | 5/2010 | Bushby | |
| 7,794,245 B2 | 9/2010 | Thompson | |
| 7,913,527 B2 | 3/2011 | Chen | |
| 8,029,299 B1 | 10/2011 | Huang | |
| 8,142,212 B2 | 3/2012 | McSweeney et al. | |
| 8,414,314 B1 | 4/2013 | Mosholder | |
| 8,449,309 B1 | 5/2013 | Mosholder | |
| 9,710,677 B1 | 7/2017 | Mosholder | |

(Continued)

*Primary Examiner* — Oscar C Jimenez
*Assistant Examiner* — Paul D Baillargeon

(57) ABSTRACT

A port protector is provided for locking insert into a communication port of electronic equipment. The port protector comprises a base member defining a support surface extending longitudinally between outer and inner ends. The locking member is deflectively coupled to the base member by a spine member extending transversely therebetween. The locking member includes an anchored portion attached to the spine member and a plank portion projecting longitudinally inward therefrom to terminate at a free end, such that the plank portion extends over the support surface of the base member. An engagement member extends from the plank portion of the locking member and is configured for retentively engaging the communication port when disposed at a locking position therein. The engagement member is releasable from the locking position responsive to the spine member being severed to decouple the locking and base members from one another.

20 Claims, 15 Drawing Sheets

(56) References Cited

U.S. PATENT DOCUMENTS

| | | |
|---|---|---|
| 2003/0224637 A1 | 12/2003 | Ling |
| 2003/0228777 A1 | 12/2003 | Lai |
| 2005/0039502 A1 | 2/2005 | Avganim |
| 2005/0164548 A1 | 7/2005 | Spears et al. |
| 2005/0202698 A1 | 9/2005 | Miao |
| 2006/0107073 A1 | 5/2006 | Lane et al. |
| 2006/0134952 A1 | 6/2006 | Meister et al. |
| 2006/0234533 A1 | 10/2006 | Lei et al. |
| 2007/0037454 A1 | 2/2007 | Bushby |
| 2007/0162655 A1 | 7/2007 | Huang |
| 2008/0041125 A1 | 2/2008 | Poppe |
| 2009/0042433 A1 | 2/2009 | Bushby |
| 2009/0117763 A1 | 5/2009 | Chen |
| 2010/0009565 A1 | 1/2010 | Wang |
| 2010/0033913 A1 | 2/2010 | Cao |
| 2012/0108088 A1 | 5/2012 | Peng et al. |
| 2012/0289069 A1 | 11/2012 | Chueh et al. |
| 2013/0029505 A1 | 1/2013 | Hackett |
| 2016/0196454 A1 | 7/2016 | Soffer |

A-A
PRIOR ART

TAMPER EVIDENT PORT PROTECTOR

FIELD OF THE INVENTION

The present invention is generally directed to a port protector for use with a communication port provided on various electronic equipment. More specifically, the present invention is directed to a tamper evident port protector which, when installed in a communication port, locks in place to physically obstruct access to such communication port and to provide conspicuous indication of tampering in the event forcible access to the communication port is made or attempted thereafter.

BACKGROUND OF THE INVENTION

Communication ports are known in the art. They include data ports of numerous types and configurations provided on various electronic equipment for interconnection of communications media thereto. For example, one or more USB, HDMI, SFP (Small Form-factor Pluggable), or other such data port types are typically provided on computers, communication devices, or on-vehicle consoles for communications interface coupling thereto. The intercoupling components of these data ports remain openly exposed in many applications when not actually coupled to external communications media for use, rendering the given equipment vulnerable to unauthorized access to its contents and controls during periods of non-use.

Port protection measures are known in the art. But the level of tamper evident protection they offer against efforts to defeat the protection, and the ease of use they offer vary widely. Port protection measures heretofore known, however, lack the full combination of secure self-locking to a communication port, tamper evident safeguards against attempts to forcibly unlock it from the communication port, and a simplicity of structure and function to facilitate convenient yet reliable use.

There is therefore a need for a port protector to address vulnerabilities like this in conventional communication ports provided on various electronic equipment. There is a need for such port protector which substantially and securely blocks unrestricted access to a communication port when the port is not in use, and which yields conspicuous residual indication of any tampering to gain unauthorized access to or through the communication port. There is a need, moreover, for a port protector that is sufficiently simple in structure and function to facilitate ease of handling and use.

SUMMARY OF THE INVENTION

It is an object of the present invention to protect a communication port by substantially and securely blocking access to the communication port during a period of non-use.

It is another object of the present invention to provide conspicuous residual indication of any tampering to gain unauthorized access to or through the communication port despite such protection.

It is yet another object of the present invention to provide protection for a communication port through a device that is simple enough in structure and function to facilitate convenient handling and use.

These and other objects are attained by a port protector provided in accordance with certain embodiments of the present invention for locking insert into a communication port of electronic equipment. The port protector comprises a base member defining a support surface extending longitudinally between outer and inner ends. A locking member is deflectively coupled to the base member by a spine member extending transversely therebetween. The locking member includes an anchored portion attached to the spine member and a plank portion projecting longitudinally inward therefrom to terminate at a free end, such that the plank portion extends over the support surface of the base member. An engagement member extends from the plank portion of the locking member and is configured for retentively engaging the communication port when disposed at a locking position therein. The engagement member is releasable from the locking position responsive to the spine member being severed to decouple the locking and base members from one another.

In accordance with certain other embodiments, a port protector is provided for self-locking insertion into a communication port of electronic equipment. The port protector comprises a base member defining a support surface extending longitudinally from an outer end to an inner end. A locking member is deflectively coupled to the base member by a spine member extending transversely therebetween. The locking member has an anchored portion attached to the spine member and a plank portion projecting longitudinally inward therefrom to terminate at a free end, the plank portion thus extending over the support surface of the base member. An engagement member extends transversely from the plank portion of the locking member and is configured for retentively engaging the communication port when disposed at a locking position therein. A shield member projects transversely from the plank portion while extending laterally across the plank portion to substantially block open access into the communication port peripherally about the locking member when lockingly inserted therein. At least one support member extends from one of the locking and base members for limiting displacement of the plank portion toward the base member upon deflection of the locking member. The engagement member is releasable from the locking position responsive to the spine member being severed to decouple the locking and base members from one another; and, the spine member is configured for residual deformation at an exposed end when severed.

In accordance with certain additional embodiments, a port protector is provided for self-locking insert into a communication port of electronic equipment. The port protector comprises in such embodiments a base member defining a support surface extending longitudinally between outer and inner ends, and a locking member deflectively coupled to the inner member by a spine member extending transversely therebetween. The locking member includes an anchored portion attached to the spine member and a plank portion projecting longitudinally inward therefrom to terminate at a free end and extend over the support surface of the base member. An engagement member extends transversely from the plank portion of the locking member and is configured for retentively engaging the communication port when disposed at a locking position therein. A shield member is provided projecting transversely from the plank portion and extending laterally across that plank portion for substantially blocking open access into the communication port peripherally about the locking member when lockingly inserted therein. At least one support member is provided extending from the locking member for limiting displacement of the plank portion toward the base member upon deflection of the locking member. A plurality of baffle members projects from the plank portion transversely toward the base member. The baffle member has a substantially planar contour defining a terminal edge extending laterally across the base member, such baffle member being configured for residual deformation along the terminal edge upon tampering contact of an intrusive instrument. The base, locking, and spine members are integrally formed to define a unitary body for insert into at least one of the communication ports with the spine member being disposed adjacent the outer end of the base member. The engagement member is releasable from the locking position responsive to the spine member being severed to decouple the locking and base members from one another.

BRIEF DESCRIPTION OF THE DRAWINGS

Various aspects of the present invention, as well as the structural and operational features of certain exemplary embodiments disclosed herein, may be better understood by reference to the following description, taken in connection with the accompanying drawings, wherein like reference numerals and characters identify like elements, in which.

DETAILED DESCRIPTION OF THE PREFERRED EMBODIMENTS

Figure 1:
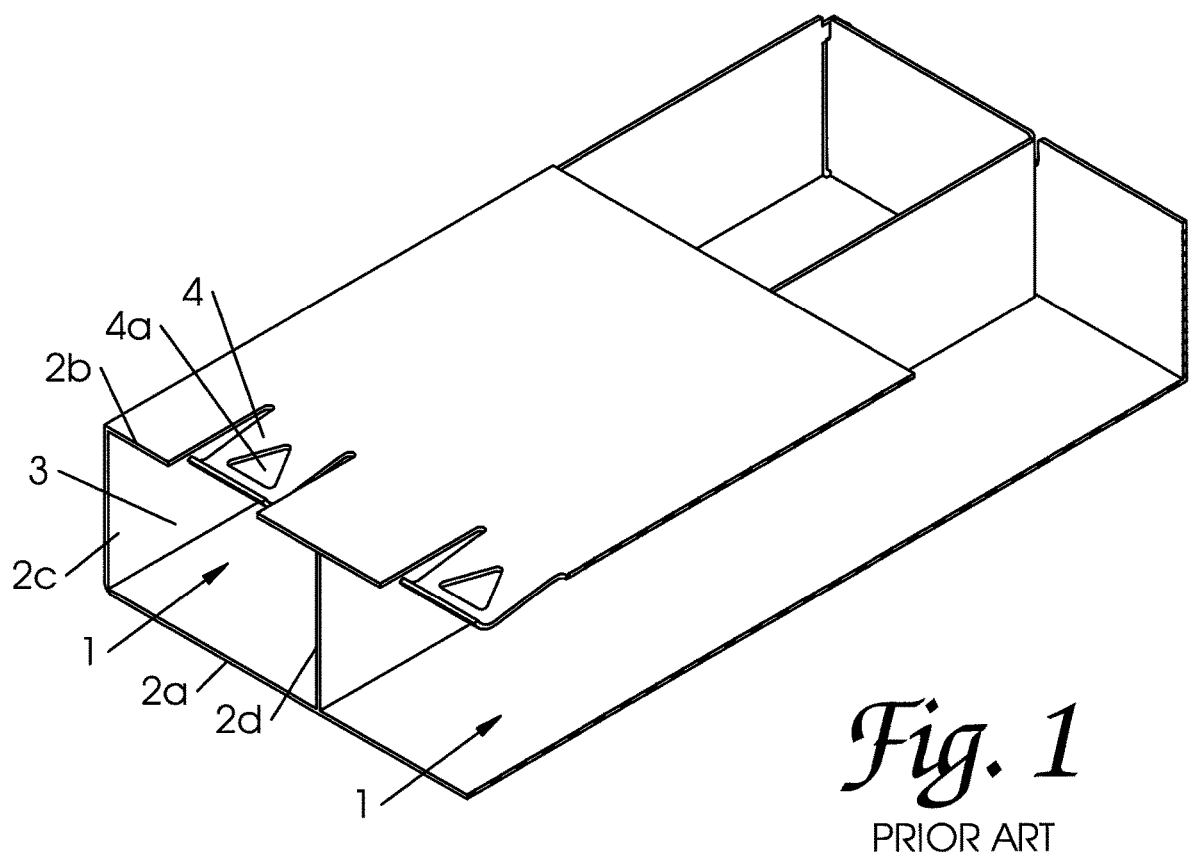
FIG. 1 is a schematic perspective view, partially cut away, of a bank of conventional communication ports known in the art.

While the present invention may be embodied in various forms suitable for particular applications, there are shown in the accompanying drawings and described in illustrative detail herein specific embodiments which exemplify the principles of the invention as implemented for certain illustrative applications. It is to be understood that this collective disclosure is meant to be illustrative and exemplary, and is not intended to limit the invention to what is illustrated and described herein.

Briefly, the present invention is directed to a port protector which may be employed for locking insert into communication ports variously provided on electronic equipment known in the art. These communication ports typically form receptacles for connectors which terminate cables and other such transmission media which are kept openly exposed when not in use. A port protector formed in accordance with one exemplary embodiment of the present invention provides various levels of protection for such communication ports. At a base level, the port protector inserts into and substantially plugs an otherwise openly exposed receptacle of a communication port until it is ready for use. This guards against unauthorized interconnection with the communication port and infiltration of dust or other foreign debris in the meantime.

Once it is positioned to engage a communication port, the port protector provides additional levels of protection. As illustratively described and shown herein, the port protector is configured to so engage the given port that it is locked in retentive engagement with the communication port without need for other extraneous components to lock the port protector in place. It is "self-locking" in this regard, and remains substantially unlockable unless it is destructively disassembled, which would leave obvious evidence of tampering. Preferably, the port protector is also configured that this evidence of destructive tampering persists to some discernible extent, even if covert measures were taken to obscure the evidence afterwards.

The port protector is preferably configured to provide another level of protection by making it difficult to defeat its locking engagement by means short of destructive disassembly. For example, the port protector is preferably equipped with one or more members for shielding or blocking disruptive insertion of an intrusive instrument between or about the port protector's various members.

The port protector preferably provides a further level of protection by making it difficult to disguise an unauthorized replica of a properly authorized port protector originally installed in a given communication port. For example, if an originally installed port protector were to be forcibly removed then replaced with an unauthorized replica of the same, this would also be evident. Each port protector in certain embodiments and applications is applied with a seemingly randomized pattern of variously shaped visual indicia such as graphic marks, spots, speckles, or the like to define an apparent 'fingerprint' for that particular port protector.

The port protector is generally provided for use as a single structure whose various members are either pre-formed or pre-assembled together in one conveniently handled package. Consequently, a user need not fumble with multiple discrete components to join together, nor take precautions to keep them from coming apart when installing the port protector. The one piece package formed by the port protector makes for convenient handling and manipulation for proper installation into a given communication port with minimal effort.

Figure 2:
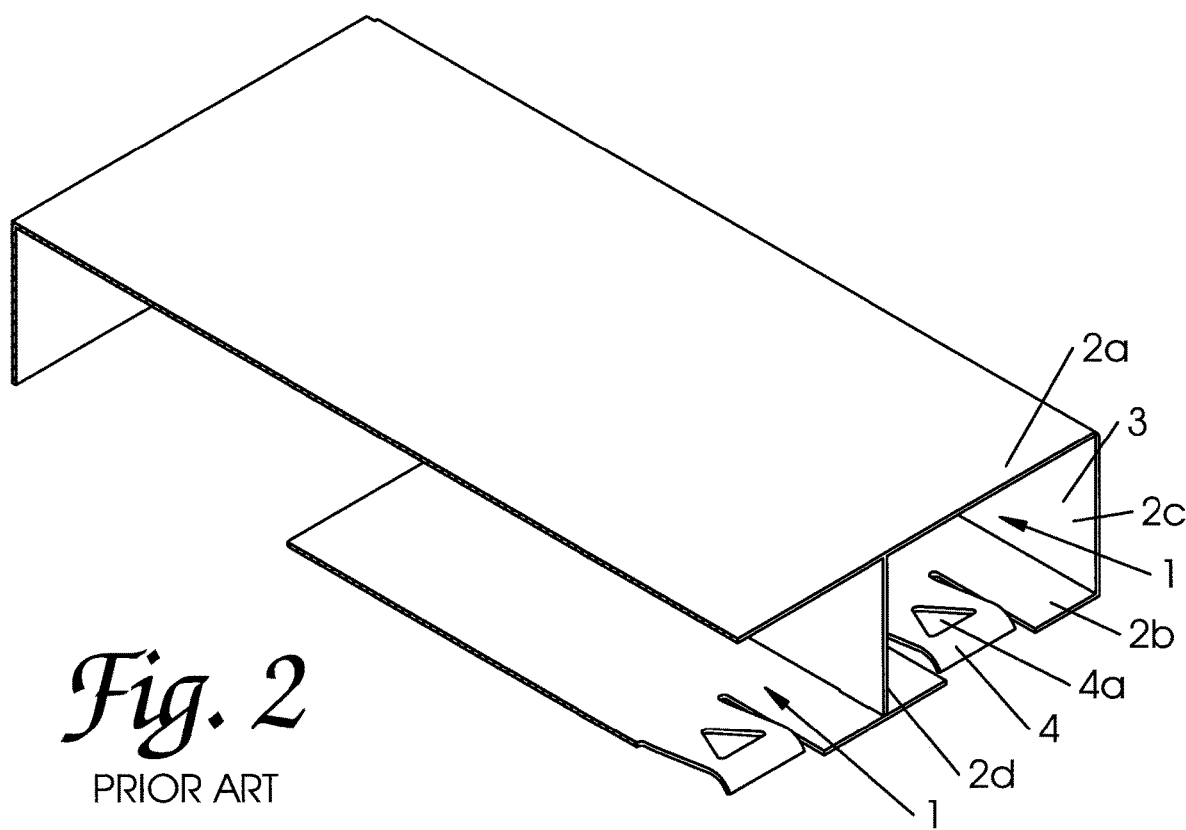
FIG. 2 is a schematic perspective view, partially cut away, of the bank of conventional communication ports shown in FIG. 1, but reversed in viewing orientation.
Figure 3:
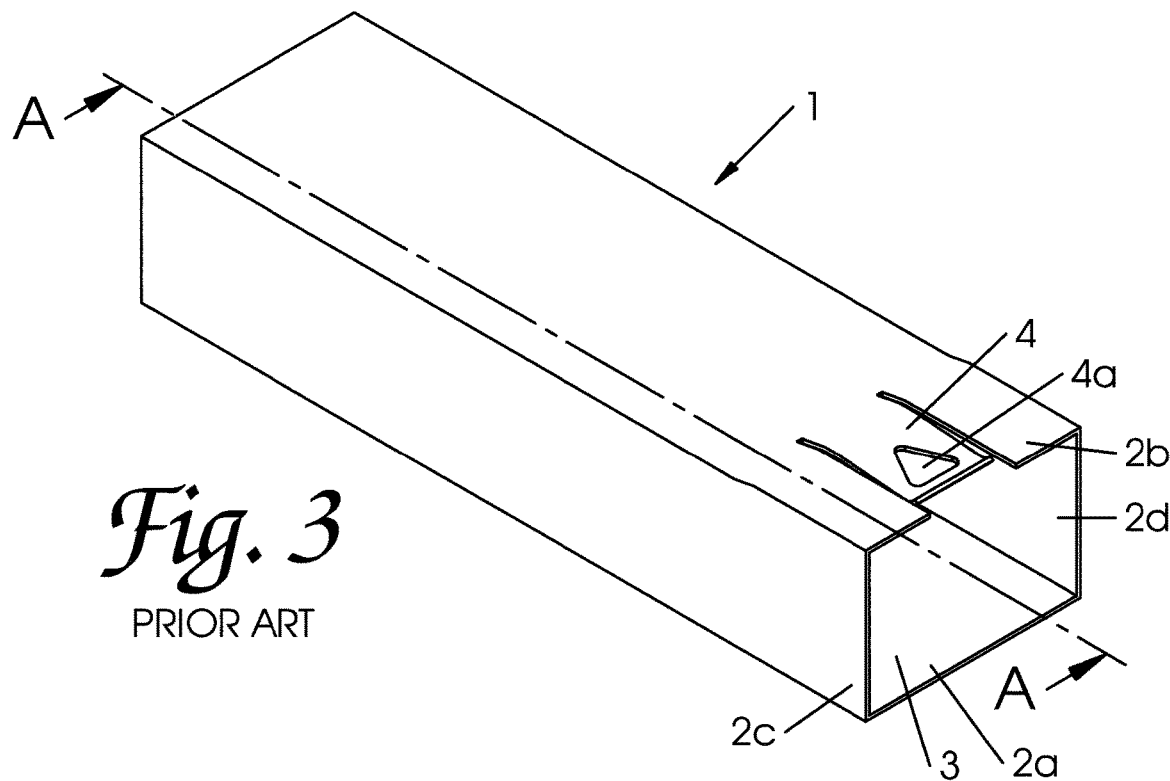
FIG. 3 is a schematic perspective view of a conventional communication port known in the art, disposed in discrete individual form.
Figure 4:
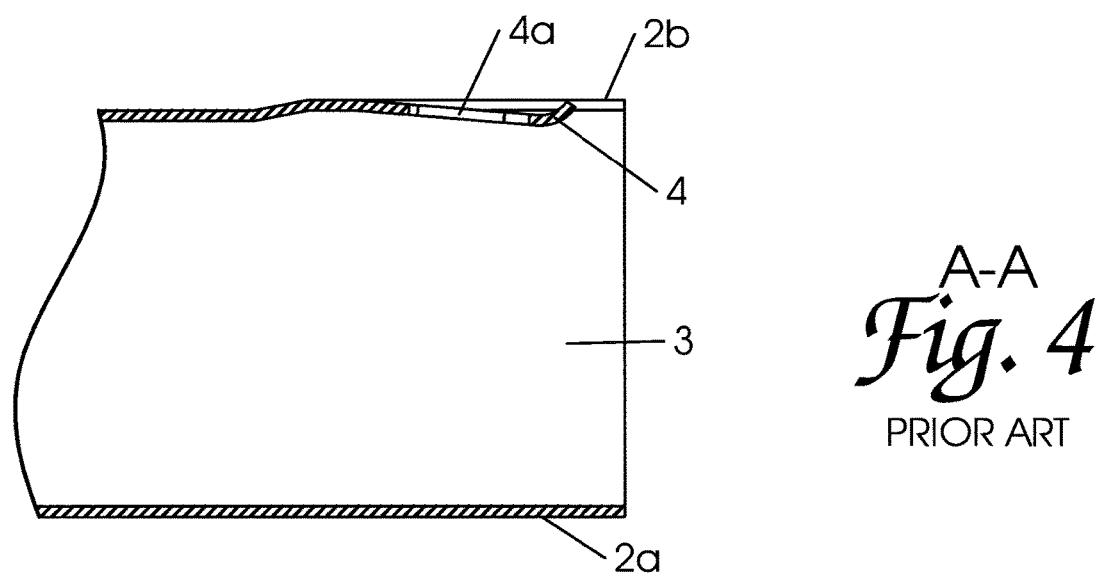
FIG. 4 is a side sectional view, partially cut away, of a portion of the conventional communication port shown in FIG. 3.
Figure 5:
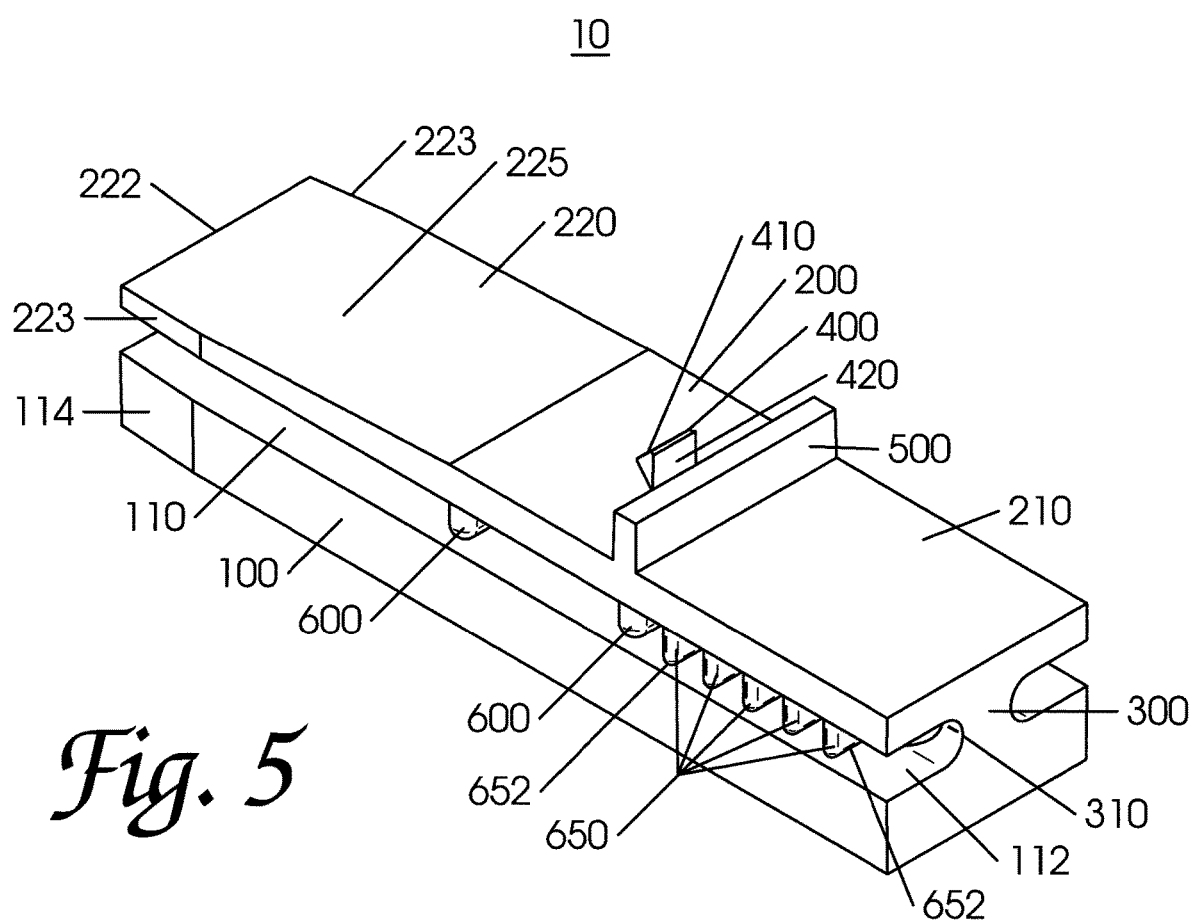
FIG. 5 is a perspective view of a port protector formed in accordance with one exemplary embodiment of the present invention as viewed downward from a trailing end vantage point.
Figure 6:
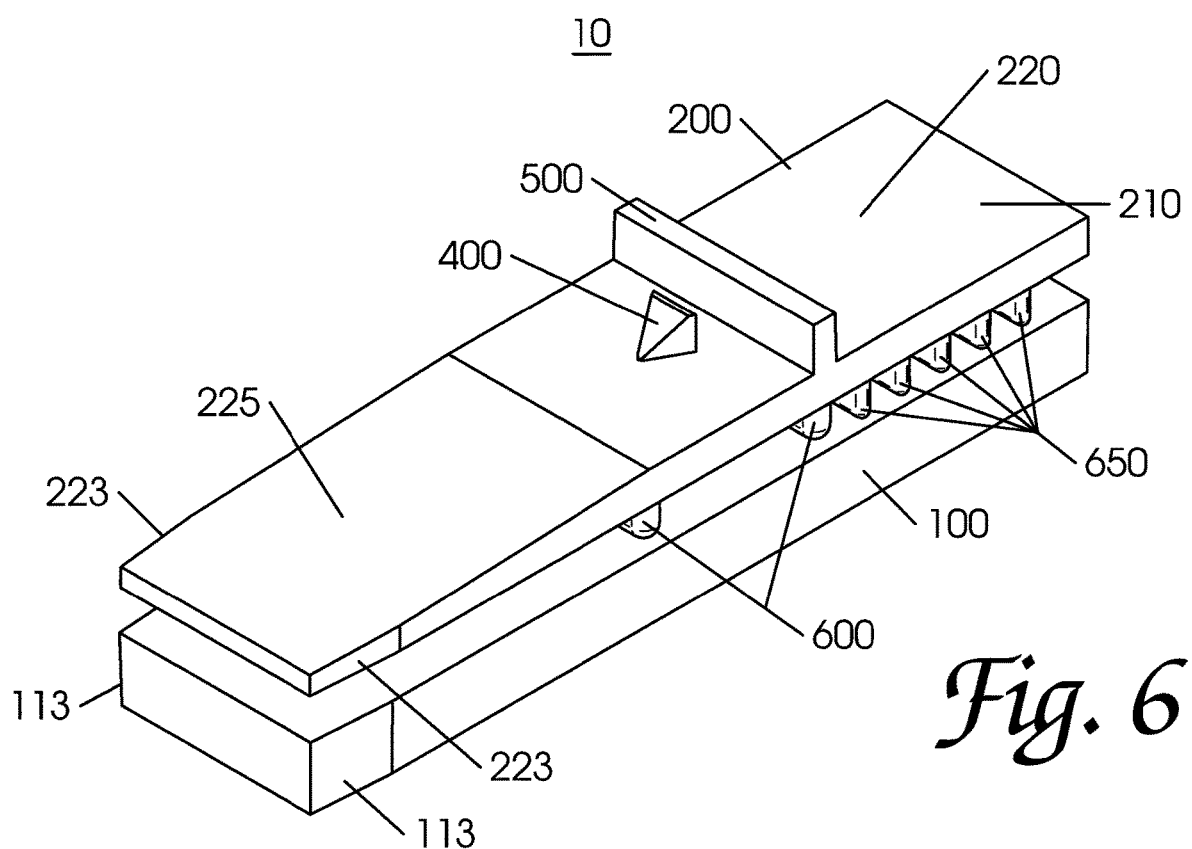
FIG. 6 is a perspective view of the embodiment shown in FIG. 5 as viewed downward from a leading end vantage point.
Figure 7:
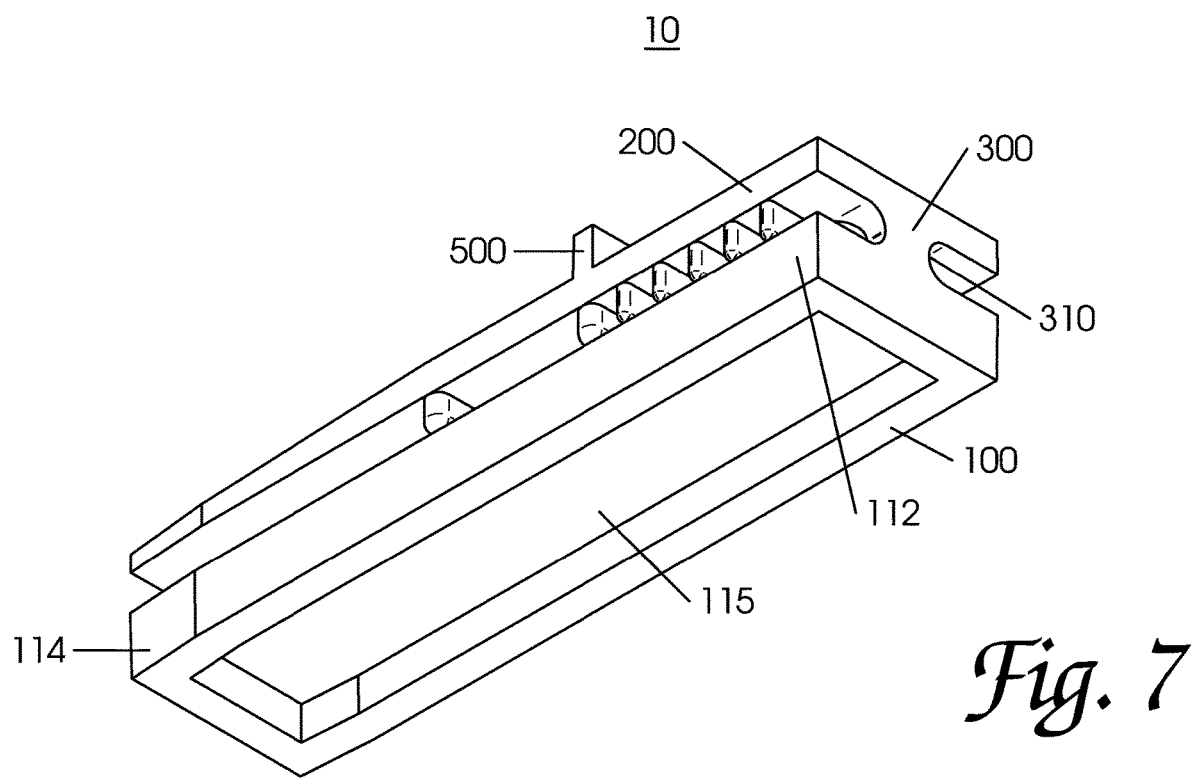
FIG. 7 is a perspective view of the embodiment shown in FIG. 5 as viewed upward from another trailing end vantage point.
Figure 8:
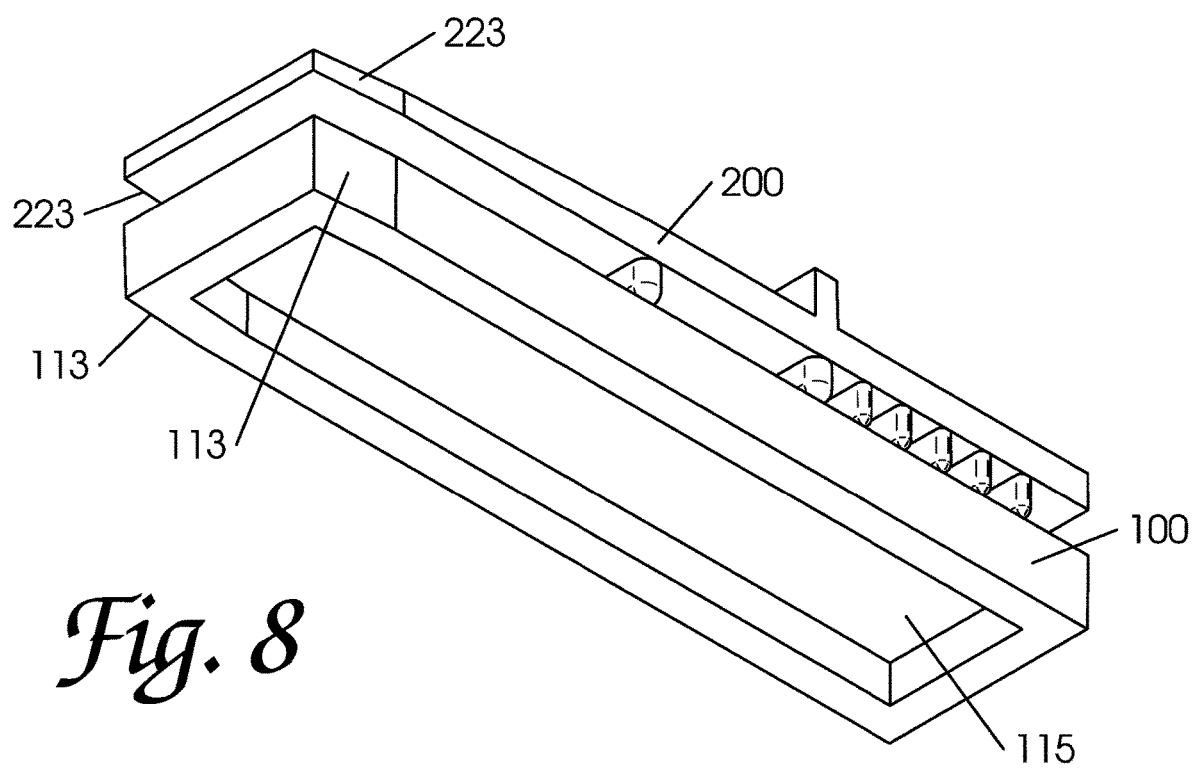
FIG. 8 is a perspective view of the embodiment shown in FIG. 5 as viewed upward from another leading end vantage point.
Figure 9:
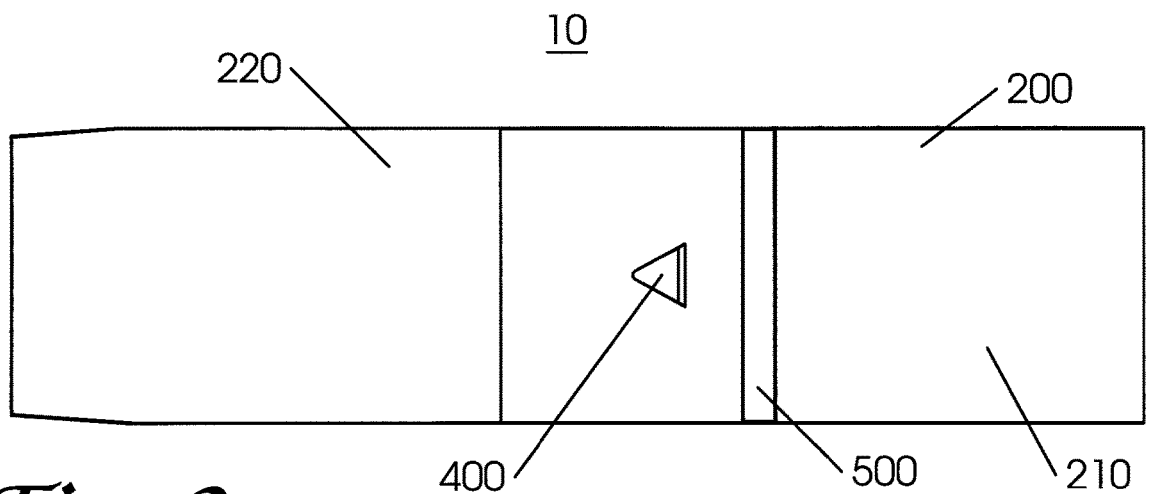
FIG. 9 is a top plan view of the embodiment shown in FIG. 5.
Figure 10:
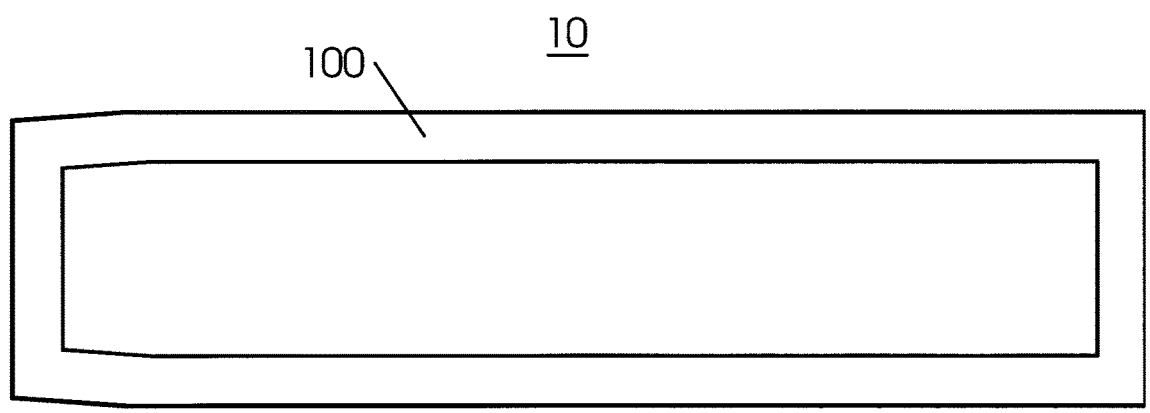
FIG. 10 is a bottom plan view of the embodiment shown in FIG. 5.
Figure 11:
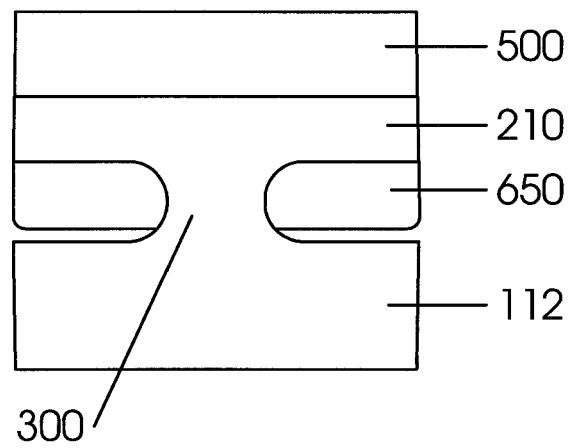
FIG. 11 is a trailing end elevational view of the embodiment shown in FIG. 5.
Figure 12:
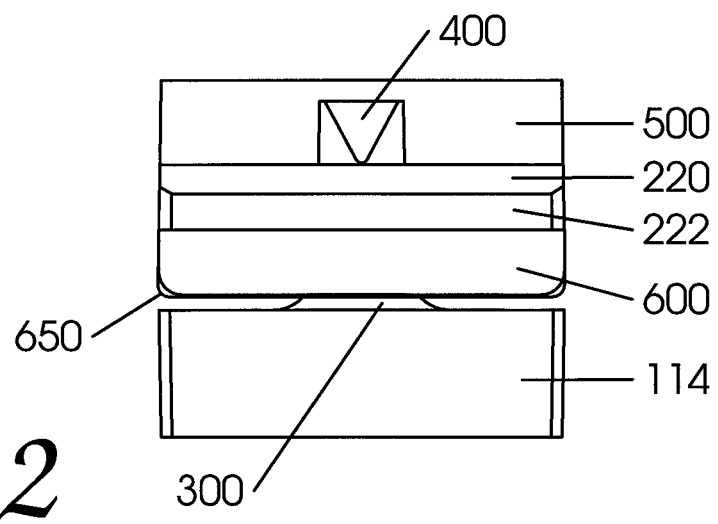
FIG. 12 is a leading end elevational view of the embodiment shown in FIG. 5.

Turning now to FIGS. 1-4, in different embodiments and applications, the port protector is suitably configured for the different types of communication ports employed by the given electronic equipment. Communication ports known in the art include data ports of various type, such as the so-called Small Form-factor Pluggable (SFP) type data port widely used in the art. Examples of such SFP data ports are schematically illustrated in FIGS. 1-4. In the example of FIGS. 1-2, a bank of SFP data ports 1 are shown adjacent one another for the interconnection of equipment often employed in telecommunications or other network communications applications. In the example of FIGS. 3-4, a discrete SFP data port 1 is shown, which is of substantially similar structure as each of the port elements illustrated in FIGS. 1-2 except that it is individually disposed.

The views of FIGS. 1-4 are simplified in the interests of brevity and clarity to show only those schematic details helpful for understanding certain features of the port protector as disclosed herein. While an SFP data port is shown, this is but one example of a communication port 1 served by a port protector implemented in accordance with the present invention; and, the port protector may be suitably adapted in configuration for use with other types of communication ports 1 known in the art without departing from the spirit and scope of the present invention as claimed.

Each communication port 1 is formed with a body that defines a receptacle/compartment 3 extending longitudinally inward from a front opening as shown. The body includes a first pair of opposed walls 2a, 2b opposing one another along a first transverse direction relative to the longitudinal extension of the receptacle 3 (such as a vertical direction), and a second pair of opposed walls 2c, 2d opposing one another along a second transverse direction relative to the longitudinal extension of the receptacle 3 (such as a lateral direction). These walls 2a-2d combine to define and substantially encircle at least a portion of a generally rectangular, longitudinally extended receptacle 3. Although not shown, the communication port 1 is normally equipped with electrical, electro-optical, and/or other such communications interface measures provided within the receptacle 3 for suitable interconnection with a connector terminating a given cable or other transmission media. One of the transversely opposed walls 2a, 2b (wall 2b in the SFP port 1 example shown) is formed with a tab 4 that is resiliently biased to protrude into the receptacle 3, and provided with an engagement opening 4a. The tab 4 thus forms a firm yet elastic leaf spring structure for latching engagement by or with a suitably mated engagement member provided on a given connection.

Turning to FIGS. 5-14B, there are shown various views illustrating a port protector 10 formed in accordance with one exemplary embodiment of the present invention. The port protector 10 is configured for self-locking insert into a communication port 1 of the given piece of electronic equipment. In this embodiment, the port protector 10 generally includes a base member 100 and a locking member 200 deflectively coupled to the base member 100 by a spine member 300 extending transversely therebetween. The base member 100 forms a support surface 110 which extends longitudinally from an outer, or trailing, end portion 112 to an inner, or leading, end portion 114.

Figure 13:
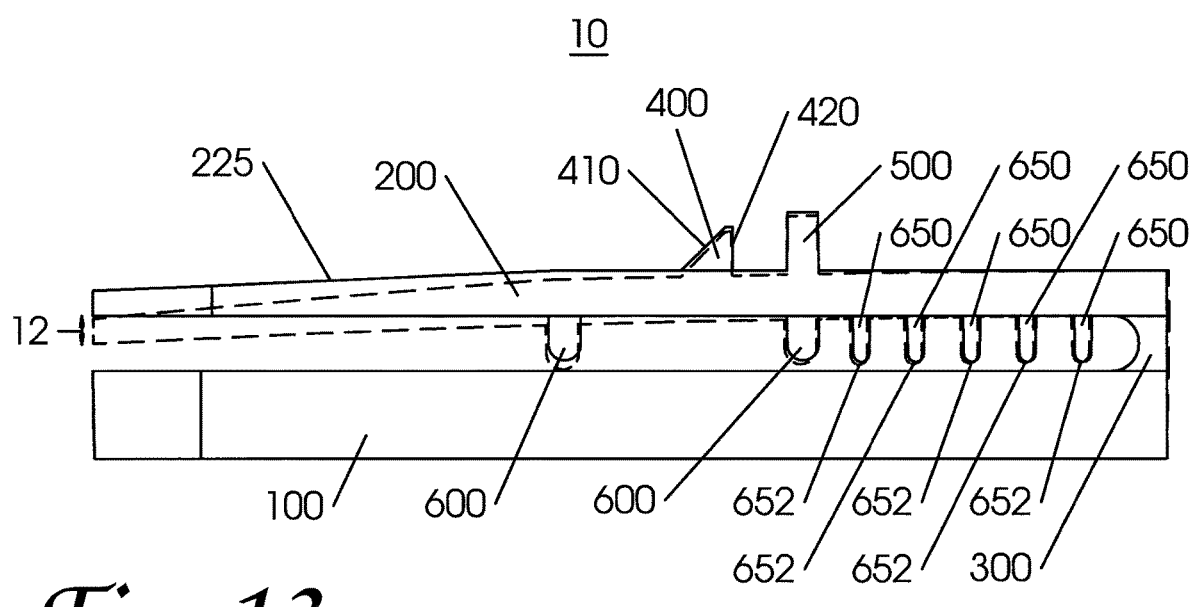
FIG. 13 is a side elevational view of the embodiment shown in FIG. 5, schematically illustrating a limited deflection of a portion thereof.

The locking member 200 is formed with an anchored portion 210 attached to the spine member 300 and a plank portion 220 projecting longitudinally inward therefrom to terminate at a free end 222. The plank portion 220 thus extends over at least a part of the support surface 110 of the base member 100, suspended in cantilevered manner from the anchored portion 210 which remains supported by the spine member 300. The locking member 200 thereby forms a leaf-spring like structure that affords a suitable (typically slight, even nominal) degree of deflection if needed for somewhat adaptive yet secure retentive engagement of the communication port's tab 4 during installation of the port protector 10. This is illustrated in phantom with broken lines and indicated by the directional arrows 12, as shown in FIG. 13.

The port protector 10 also includes an engagement member 400 which extends from the locking member's plank portion 220, and serves to effect this retentive engagement of the communication port's tab 4. The engagement member 400 is suitably shaped, sized, and positioned on the plank portion 220 to securely engage the engagement opening 4a of the tab 4 when the port protector 10 is installed to a locking position within the communication port's receptacle/compartment 3. The engagement member 400 in this embodiment is formed as a semi-pyramid-like protrusion preferably formed with an inclined surface 410 which ramps upward and terminates abruptly at an end wall 420.

The inclined surface 410 forms a ramp which guides smooth engagement and gradual deflection of the tab 4 outwardly away from the receptacle 3 during insertion of the port protector 10 along a longitudinal direction into that receptacle 3. This continues as the port protector 10 is further inserted into the receptacle 3 until the free end wall 420 advances enough to reach the engagement opening 4a. Conversely, the communication port's tab 4 at that point sufficiently clears the inclined surface 410 ramp, such that it is freed to return to its biased position transversely back towards the plank portion 220. The tab opening 4a is then engaged by the engagement member's end wall 410 to lock against longitudinal withdrawal of the port protector 10 out of the receptacle 3. Depending on the particular configuration of the tab 4 actually employed by a given communication port 1 in other embodiments and applications, the engagement member 400 may be formed with other configurations to suit geometries for the tab 4 different from that shown, such that it provides secure latching or other retentive engagement therewith.

The port protector 10 includes as well a shield member 500 formed to project transversely from the locking member's plank portion 220. The shield member 500 is formed to extend laterally across the plank portion 220. It is sized and positioned on the plank portion 220 to substantially block open access into the receptacle 3 of the communication port 1 through any space/clearance that may remain peripherally about the plank portion 220 even when the locking member 100 is fully inserted into the receptacle 3. The shield member 500 is formed in this embodiment with a planar wall configuration that spans substantially the full lateral width of the plank portion 220, but may be adapted in configuration accordingly in alternate embodiments to suit various geometries of communication ports particularly encountered in other applications.

The port protector 10 further includes at least one support member 600 disposed between the base and locking members 100, 200. In the embodiment shown, the support member 600 is formed together with the locking member 200 to project transversely therefrom towards the base member 100. In certain alternate embodiments, the support member 600 may be formed together with the base member 100 to project transversely from that member instead.

The support member 600 is formed in this embodiment with a substantially planar contour that extends laterally across both of the locking and base members 100, 200 to provide evenly distributed stopping support between them. The support member 600 may be otherwise configured and arranged between the base and locking members 100, 200, so long as it provides substantially uniform support laterally across these members to firmly limit the maximum deflective displacement of the plank portion 220 toward the base member 100. This stops the plank portion 220 from yielding excessively while allowing for some nominal deflection, if needed, to accommodate proper engagement with the port's tab 4 and its engagement opening 4a (as illustrated in FIG. 13). That is, the locking member 200 presents an engagement structure for the communication port's tab 4 with some deflective give—though the range of deflection is firmly limited.

An advantage of the skirt- or wall-like panel structure shown for each of the support members 600 in this embodiment is that it forms an effective partitioning barrier. Such structure offers an added layer of shielding against intrusive access into the communication port's receptacle 3 through the space between the base and locking members 100, 200. While shown in the disclosed embodiment to extend substantially across the full lateral width of both the base and locking members 100, 200, each support member 600 may be formed to extend only partially thereacross in other embodiments and applications. Furthermore, the support member 600 may be shaped with a curvilinear or other contour different from the straight generally rectangular planar contour illustrated, if necessary to better suit the needs of the particularly intended application in other embodiments.

Turning to the spine member 300, that member joins the base member 100 (at its outer/trailing end portion 112) and the locking member 200 (at its anchored portion 210). The spine member 300 forms a pillar-like structure which defines a fulcrum for supporting the cantilevered suspension of the locking member's plank portion 220 therefrom. As such, the spine member 300 is formed of a thermoplastic or other such material known in the art having sufficient strength and rigidity to provide stable support. It is preferably formed with such material and configured with such suitable geometric features, however, to be conducive to severing with a conventional handheld cutting tool when time comes for release and removal of the port protector 10 from its locked position within the communication port 1.

In accordance with certain aspects of the present invention, the spine member 300 is so configured that residual deformation is left at each of its exposed ends when severed. The spine member 300 as implemented in this regard forms a suitable bulk of material like polycarbonate, acrylic, or other such thermoplastic material, with a substantially I-shaped, or anvil-shaped, sectional profile (as disposed between the outer end portion 112 of the base member and the anchoring portion 210 of said locking member) in the embodiment shown. This sectional profile preferably presents a mid-portion 310 that is of reduced width/thickness which makes for a convenient cutting point at which to cut and sever the locking member 200 from the base member 100. The spine member 300 is configured in this or other suitable manner to provide a stable yet readily severable structure, which when cut leaves stumps 310a, 310b having jagged exposed end faces 315a, 315b (see FIG. 14A, 14B). These jagged end faces 315a, 315b, even when carefully fused back together, resist neat and undistorted repair. Hence, they serve to impede and frustrate attempts to avoid detection of prior breakage, removal, and repair actions.

In certain embodiments, the port protector 10 also includes a plurality of baffle members 650 projecting from the plank portion 220 transversely toward the base member 100. The baffle members 650 are spaced apart, each having a substantially planar contour defining a terminal edge 652 that opposes and extends laterally across the base member's support surface 110. These baffle members 650 are preferably disposed toward the anchored portion 210 of the plank member 220, such that they remain outside the communication port's receptacle 3 when the port protector 10 is fully installed to its locked position. They provide a series of barriers against the intrusive insert of a foreign instrument between the base and locking members 100, 200, to thwart tampering attempts.

Moreover, the terminal edge 652 of each baffle member 650 is suitably configured in material composition and geometry (for example, sufficiently thinned out) to heighten susceptibility to residual deformation therealong if impacted by an intrusive instrument. For instance, due to the generally converging, or thinned, profile of the terminal edge 652, and the natural properties of a thermoplastic material composition, the edge would be heightened in sensitivity to indentation or other disfiguration 653 by the flat head of a screw driver or other such instrument pried underneath it (see FIG. 14A).

While shown in the disclosed embodiment to extend substantially across the full lateral width of both the base and locking members 100, 200, one or more of the baffle members 650 may be formed to extend only partially thereacross in other embodiments and applications. Furthermore, the baffle members 650 may be shaped with a curvilinear or other contour different from the straight generally rectangular planar contour illustrated, if necessary to better suit the needs of the particularly intended application in other embodiments.

The various members of the port protector 10 are preferably provided as one single-piece unit that may be conveniently handled by a user in the field and simply installed on a communication port to be protected without any special preparation or manipulation. While provided as one single-piece unit, any or all of the port protector's members described herein may be discretely formed then fused or otherwise affixed to the other members by suitable means known in the art prior to delivery or deployment. In certain embodiments, however, many if not all members of the port protector 10 including its base, locking, and spine members are preferably formed integrally with one another using molding processes or other such suitable means known in the art.

Figure 15:
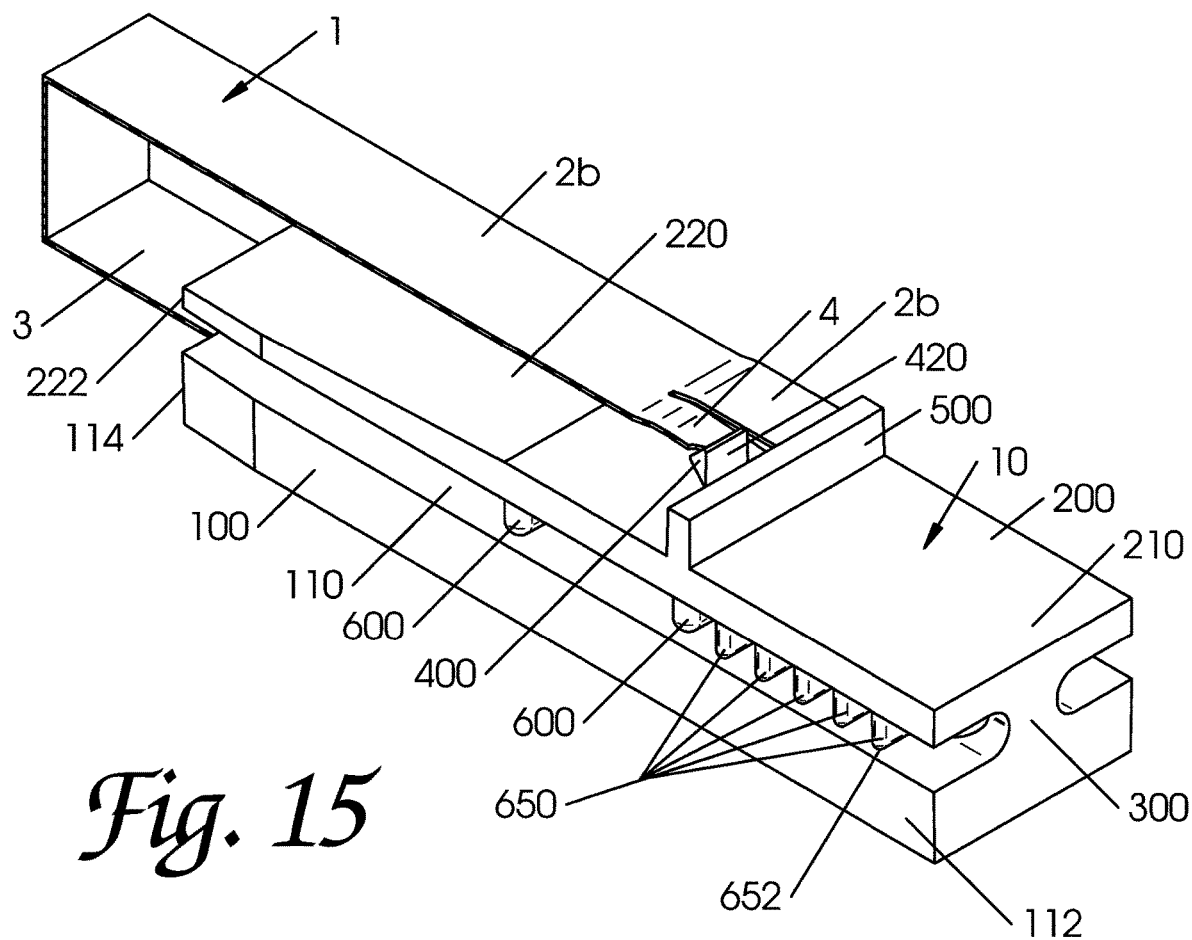
FIG. 15 is a perspective view, partially cut away, illustrating the embodiment of FIG. 5 as installed to a locking position on the conventional communication port shown in FIG. 3.
Figure 16:
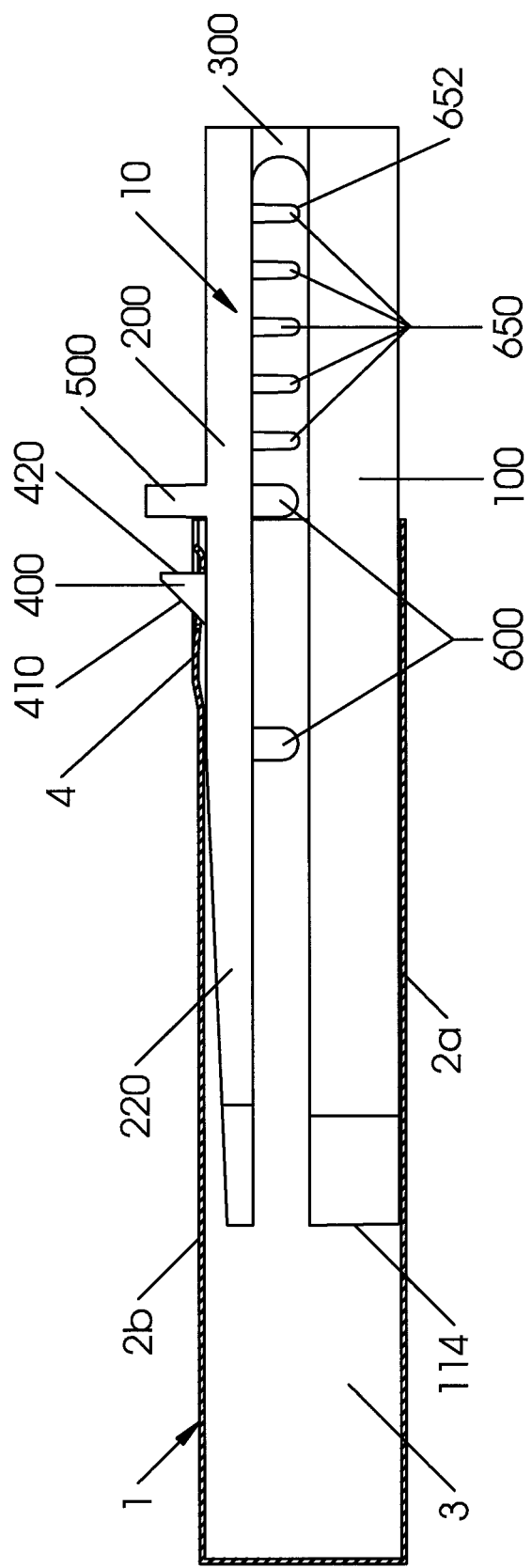
FIG. 16 is a side elevational view, partially cut away illustrating the embodiment of FIG. 5 as installed to a locking position on the conventional communication port shown in FIG. 3; and, FIG. 17 is a perspective view of a port protector formed in accordance with another exemplary embodiment of the present invention as viewed downward from a leading end vantage point.

Referring now to FIGS. 15-16, the port protector 10 is shown fully installed on a communication port 1, which is partially cut away in the respective views for clarity of illustration. For operational use of the communication port 1, a matching connector (not shown) would be inserted into the receptacle 3 for mated engagement with that communication port 1, deflecting the tab 4 as it advances until it 'clicks in' to retentively engage the tab's opening 4a. A port protector 10 is inserted in much the same manner into the receptacle 3, as shown, in order to protect and secure the communication port 1 until it is ready for operational use with such matching connector.

During typical use, the port protector 10 is inserted into the receptacle 3 of the communication port 1, leading with the inner end portion 114 of the base member 100 and the free end 222 of the locking member 200. To help guide entry into the opening into the receptacle 3, these parts of the base and locking members 100, 200 are preferably formed with contours that taper or converge towards their leading ends. For example, the inner end portion 114 is formed with tapered surfaces 113 which gradually reduce the width of the end portion 114 as it terminates. The plank portion 220 of the locking member 200 is likewise formed with tapered surfaces 223 which gradually reduce the width of the plank portion 220 as it terminates. The plank portion 220 in this embodiment is also formed with a sloped surface 225 which gradually reduces the thickness of the end portion 114 as it terminates.

As the port protector 10 advances further into the receptacle 3, the engagement member 400 which projects from the plank portion 220 contacts and deflects the communication port's tab 4 out of the way (against the tab's elastic bias). Eventually, the engagement member 400 advances to the point that its ramp surface 410 clears the proximal parts of the tab 4 and reaches the tab's opening 4a. Much like a leaf spring, the tab 4 at that point is released to return (by its elastic bias) to its original undeflected position, receiving the engagement member 400 within its opening 4a. The parts of the tab 4 surrounding the opening 4a then capture the engagement member 400, thereby retentively locking the port protector 10 in place, where it occupies the communication port 1 to protect the same against unauthorized access until it is to be opened for properly authorized use.

In this manner, the engagement member 400 'clicks' into retentive engagement of the tab 4, thereby securing the port protector 10 in its fully installed, locking position. Disposed as it is at the outer end portion 112 of the base member 100, the spine member 300 remains exposed outside the communication port 1, as shown. The communication port 1 then remains locked and inaccessible so long as the port protector 10 remains in place. This provides a base level of protection for the communication port 1.

When the communication port 1 is to be unlocked and opened for use, the installed port protector 10 must of course be removed. This requires the port protector's engagement member 400 to be released safely from its engagement with the tab 4, without damaging that tab 4 or any other part of the communication port 1. To safely release and remove the port protector 10, the spine member 300 is cut to separate the locking and base members 200, 100 from one another. Each member 200, 100 may then be easily manipulated to remove from the communication port 1 without damaging effect on the port.

Figure 14A:
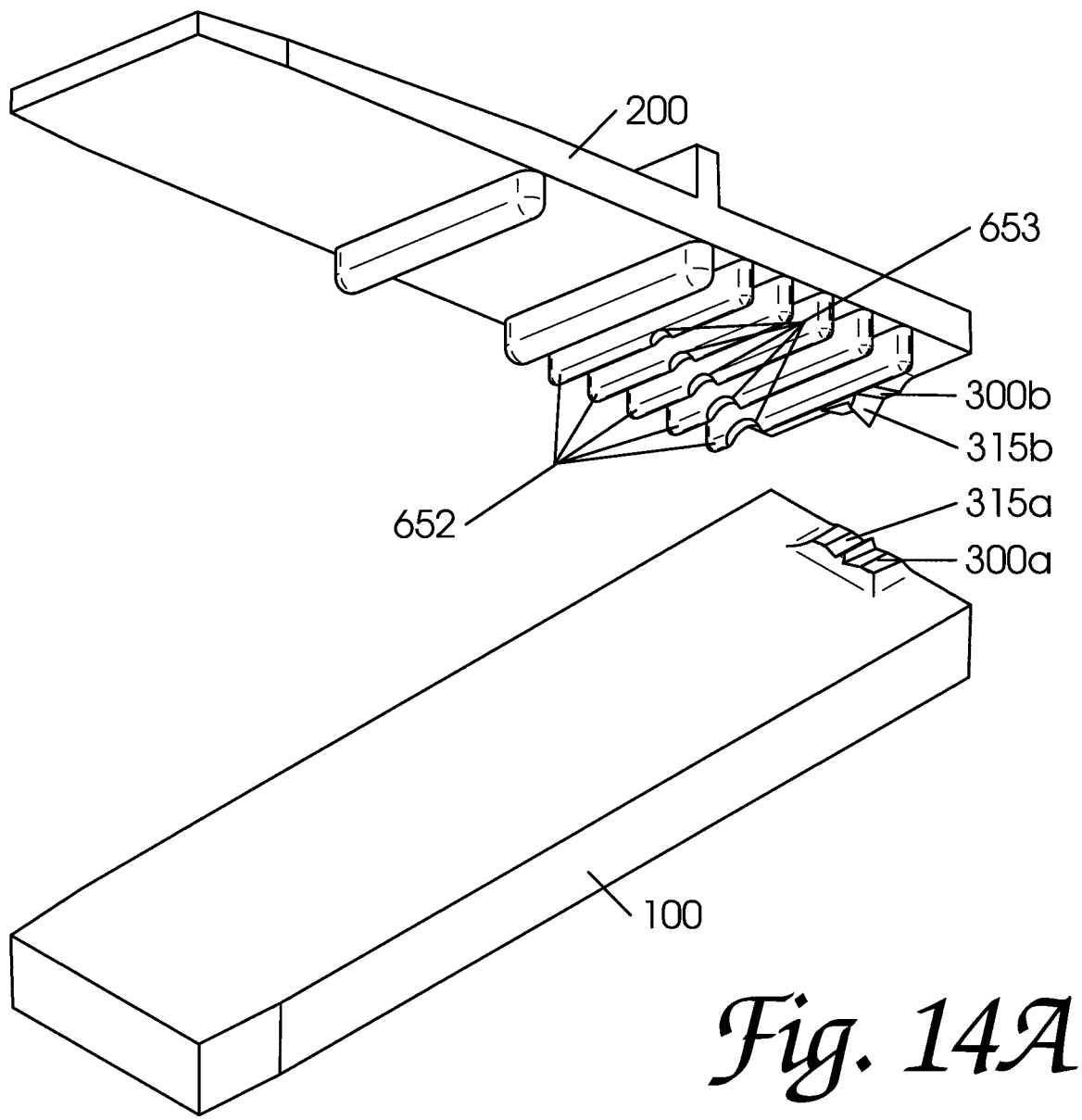
FIG. 14A is a partially exploded perspective view of the embodiment as shown in FIG. 6 from a leading end vantage point, with a portion of the port protector decoupled by severing destruction of a spine member thereof.
Figure 14B:
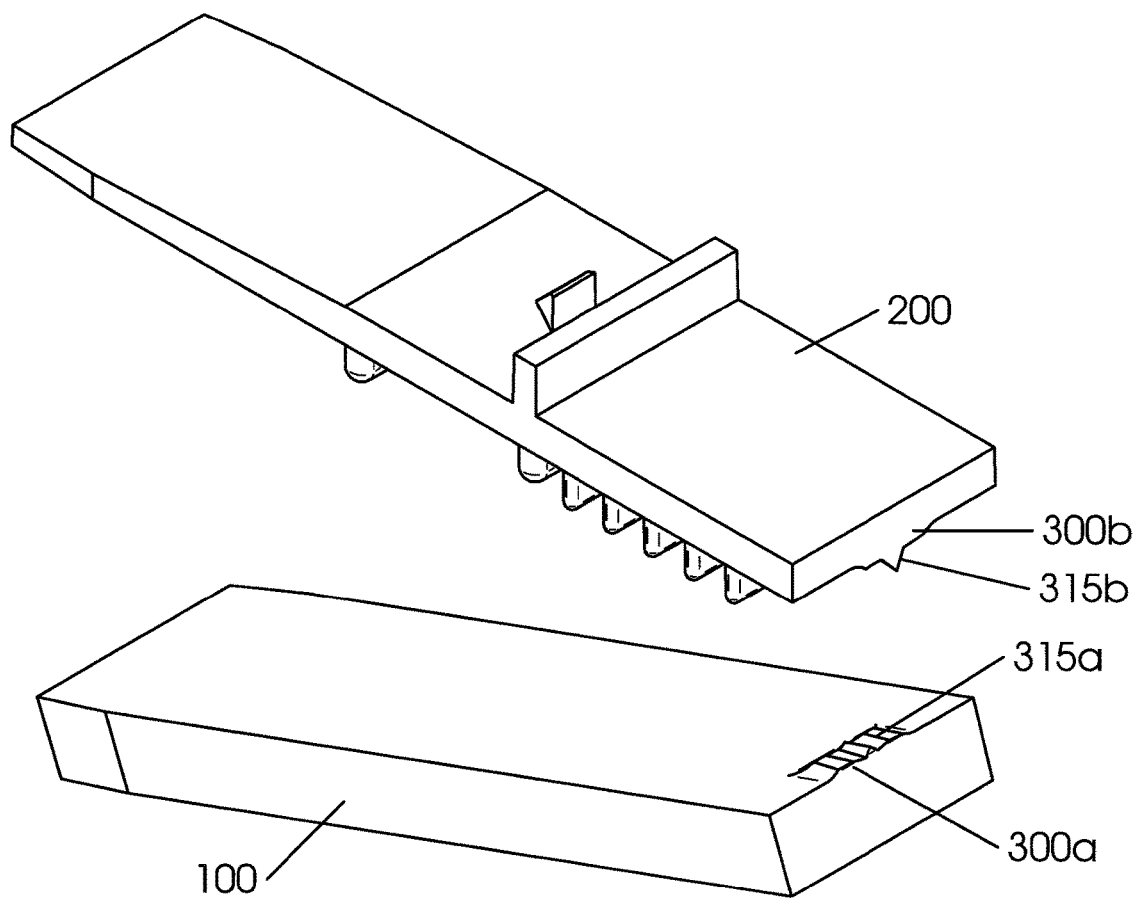
FIG. 14B is a partially exploded perspective view of the embodiment as shown in FIG. 5 from a trailing end vantage point, with a portion of the port protector decoupled by severing destruction of a spine member thereof.

Another level of protection is provided as this destructive disassembly required for unlocking necessarily leaves conspicuous evidence of tampering, regardless of the circumstances. That is, unlocking to release the port protector's retentive engagement of the communication port requires at least partial physical destruction of the port protector 10 in order to separate and free certain of its structural members from one another enough for removal. As illustrated in FIGS. 14A-14B, the locking member 200 may be decoupled from the base member 100 (to release the port protector 10 from its locking position) responsive to the spine member 300 being severed. The destruction necessary to sever the spine member 300 (at its reduced thickness mid-portion 310 in the illustrated embodiment) leaves obvious evidence of tampering at the exposed jagged ends 315a, 315b of the resulting spine member stumps 300a, 300b, authorized or unauthorized as the case may be.

Preferably, the port protector 10 is so configured that this evidence of destruction (315a, 315b) persists to some discernible extent, even if covert measures are taken to obscure the evidence afterwards. In the port protector 10 shown, the jagged, disfigured edges 315a, 315b left by a cutting tool squeezing, mashing, and/or cutting to eventually sever the spine member 300 intermediately leaves sufficient residual deformation at the exposed ends/surfaces 315a, 315b that it becomes difficult to repair the destruction without leaving any trace. This residual deformation provides an added level of protection.

As noted in preceding paragraphs, the port protector 10 preferably provides yet another level of protection by making it difficult to defeat its locking engagement without destructive disassembly. For example, the port protector is preferably equipped with a shield member 500 which covers unwanted space that may be left within the communication port's receptacle peripherally about the port protector 10 even after its full locking insert into the receptacle 3. Protective measures such as baffle members 650 are preferably also provided to block vulnerable internal spaces between different members or portions of the port protector 10 against passage of an intrusive instrument therethrough. One or more of the baffle members 652 are preferably configured to suffer residual deformation to preserve evidence of tampering, in the event that an intrusive instrument is indeed passed by or through them.

The port protector 10, 20 in accordance with certain aspects of the present invention is provided for use as a single structure whose various members are either preformed or pre-assembled together in one conveniently handled package. In certain applications, the port protector 10, 20 may be installed prior to deployment of the given equipment. In other applications, the equipment may already be deployed, and a communication port 1 to be protected 'buried' amidst a forest of surrounding cables and other hardware—especially if provided on electrical equipment held in a rack with numerous other equipment. Communication ports 1 in such situations may require dexterous and strained contortion of the user to reach. The ability to easily hold the single package port protector 10, 20 and lock the same to the communication port 1 with one hand greatly facilitates the task of its safe installation.

Figure 17:
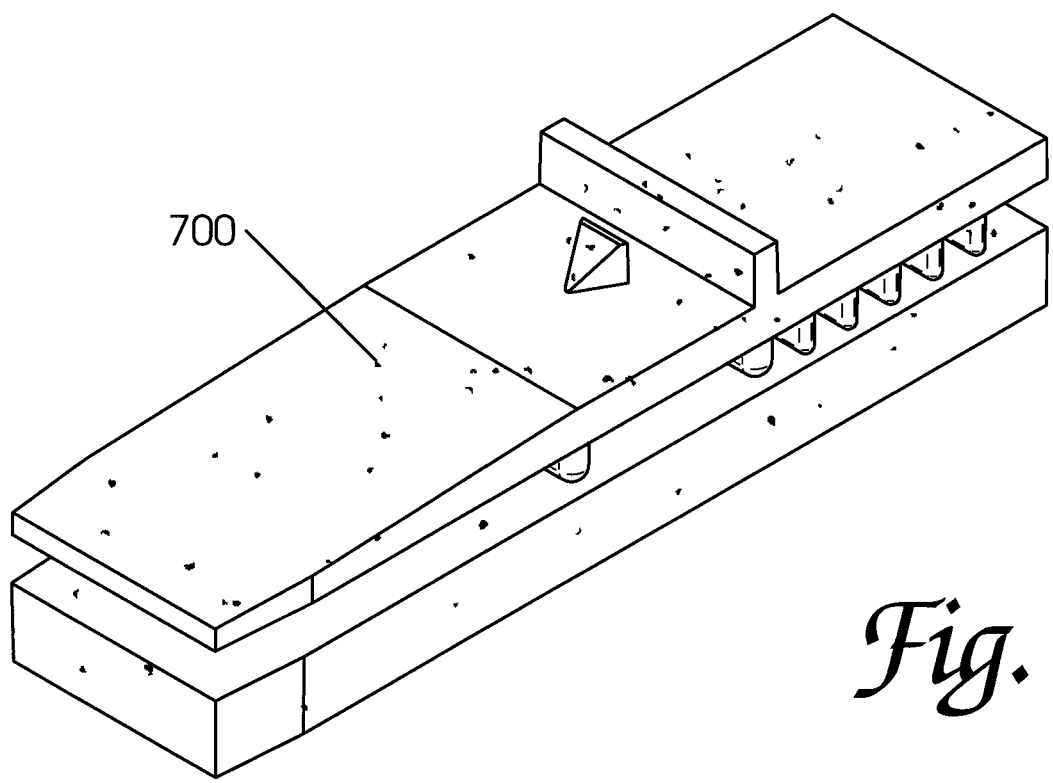

Referring to FIG. 17 showing a port protector 20 formed in accordance with another exemplary embodiment of the present invention, still another level of protection is realized by making it difficult to replace an original, authentic, port protector 20 with an unauthorized replica (after forcibly removing the authentic one). FIG. 17 illustrates an example of a visual 'fingerprint' added to the port protector 10. The port protector 20 is generally of the same structure as described for the port protector 10 in the embodiment illustrated in FIGS. 5-14B. But in addition to being labeled perhaps with a serial number or other designator (not shown), the port protector 20 is applied with a seemingly randomized pattern of variously shaped visual indicia 700 such as graphic marks, spots, speckles, or the like to enhance its unique visual profile.

The visual indicia 700 is applied at least on readily visible external surfaces of one or more marked members of the port protector 20. Depending on the particular application, this visual indicia 700 may be pseudo-randomly configured in shape, size, and pattern of arrangement, and is preferably applied on and/or within visible surfaces of at least a part of the port protector. This defines an apparent 'fingerprint' for the port protector 20, presenting an added dimension of difficulty to replicating an authentic port protector closely enough to escape detection.

Where a given part of the port protector 20 is formed of a translucent material as in the embodiment shown, the visual indicia 700 may also be embedded within the material as well. For example, a plurality of pseudo-randomly shaped, sized, and arranged dark speckles 700 may be formed both on and within the material. The visibility of speckles 700 disposed in parts of the port protector 20 behind or underneath a directly viewed surface, in addition to those formed on the directly viewed surface, adds to the apparent randomness of the speckles 700, thereby augmenting the complexity and uniqueness of the port protector's apparent fingerprint. This in turn raises the difficulty of replicating an original port protector 10 closely enough to escape detection.

The various members of the port protector 10, 20 may each be formed of any suitable material known in the art having the requisite electrical and mechanical properties for the particularly intended embodiment and application. In the embodiments shown, the various members of the port protector 10, 20 are preferably formed of a polycarbonate, acrylic, or other thermoplastic polymer material. The material preferably provides sufficient electrical insulation to avoid undue shock hazard and offers sufficient rigidity and strength to maintain stable locking engagement of the communication port 1, while readily subject to surface indentation, scratching, and tear where needed (as in the case, for example, of the baffle members 650 and spine member 300).

Suitable measures known in the art may be employed, of course, to optimize practical factors for implementation such as the structural properties resulting in the port protector 10, 20, ease of its manufacture, and the like. Accordingly, the port protector 10, 20 in the disclosed embodiments preferably include in the base member 100, for example, an outer recess 115. This recess 115 reduces the overall strength to weight ratio of the port protector 10, 20 in view of the thermoplastic polymer making up most if not all of its members. In view of known molding processes by which the base member 100 may typically be fabricated, the reduction in molded material due to the recess 115 makes structural tolerances generally more readily attainable (than, for instance, larger and thicker runs of molded material).

In the embodiments shown, the port protector 10, 20 is illustratively configured for use to protect an SFP type data port. In other embodiments, it may be adapted for use with other types of communication ports such as USB data ports, HDMI data ports, or the like, as required for the particularly intended applications. While shown in the illustrated embodiments configured for locking insert in a single communication port 1, the port protector 10, 20 in certain other embodiments may be expanded in configuration for locking insert into multiple communication ports at once.

Although this invention has been described in connection with specific embodiments and forms thereof, it will be appreciated that various modifications other than those described or mentioned above may be resorted to without departing from the spirit or scope of the invention as defined in the appended claims. For example, functionally equivalent elements may be substituted for those specifically shown and described, certain features may be used independently of other features, and in certain cases, particular locations of elements or particular ordering of method steps or processes may be reversed or interposed, all without departing from the spirit or scope of the invention as defined in the appended claims.

What is claimed is:

1. A port protector for locking insert into a communication port of electronic equipment, comprising:
   a base member defining a support surface extending longitudinally between outer and inner ends;
   a locking member deflectively coupled to said base member by a spine member extending transversely therebetween, said locking member having an anchored portion attached to said spine member and a plank portion projecting longitudinally inward therefrom to terminate at a free end, said plank portion extending over said support surface of said base member; and,
   an engagement member extending from said plank portion of said locking member and being configured for retentively engaging the communication port when disposed at a locking position therein;
   wherein said engagement member is releasable from the locking position responsive to said spine member being severed to decouple said locking and base members from one another.

2. The port protector as recited by claim 1, wherein said base, locking, and spine members are integrally formed to define a unitary body for insert into at least one of the communication ports.

3. The port protector as recited by claim 2, wherein said engagement member is integrally formed with said locking member.

4. The port protector as recited by claim 2, wherein said base, locking, and spine members are each formed of a thermoplastic material.

5. The port protector as recited by claim 4, wherein said spine member is configured for residual deformation at an exposed end when severed.

6. The port protector as recited by claim 5, wherein said spine member is disposed adjacent said outer end of said base member; and, said outer end of said base member, said spine member, and said anchoring portion of said locking member collectively define a substantially I-shaped sectional profile.

7. The port protector as recited by claim 2, wherein said base, locking, engagement, and spine members are together configured for locking insert into a communication port of Small Form-factor Pluggable (SFP) type.

8. The port protector as recited by claim 1, further comprising a shield member projecting transversely from said plank portion away from said base member, said shield member extending laterally across said plank portion for substantially blocking open access into the communication port peripherally about said locking member when lockingly inserted therein.

9. The port protector as recited by claim 1, further comprising at least one support member extending from one of said locking and base members for limiting displacement of said plank portion toward said base member upon deflection of said locking member.

10. The port protector as recited by claim 1, further comprising at least one baffle member projecting from one of said locking and base members transversely towards the other, said baffle member having a substantially planar contour defining a terminal edge extending laterally across said one locking or base member, said baffle member being configured for residual deformation along said terminal edge upon tampering contact of an intrusive instrument.

11. The port protector as recited by claim 10, comprising a plurality of said baffle members projecting transversely from said plank portion of said locking member, said baffle members being longitudinally spaced from one another to extend substantially in parallel laterally across said plank portion.

12. The port protector as recited by claim 1, wherein at least one of said base, locking, engagement, and spine members is formed with visual indicia pseudo-randomly configured in shape, size, and pattern of arrangement to define an apparent fingerprint for the port protector.

13. The port protector as recited by claim 12, wherein at least said base and locking members are each formed of a translucent material; and, said visual indicia includes a plurality of pseudo-randomly configured speckles embedded therein.

14. A port protector for self-locking insertion into a communication port of electronic equipment, comprising:
    a base member defining a support surface extending longitudinally from an outer end to an inner end;
    a locking member deflectively coupled to said base member by a spine member extending transversely therebetween, said locking member having an anchored portion attached to said spine member and a plank portion projecting longitudinally inward therefrom to terminate at a free end, said plank portion extending over said support surface of said base member;
    an engagement member extending transversely from said plank portion of said locking member and configured for retentively engaging the communication port when disposed at a locking position therein;
    a shield member projecting transversely from said plank portion and extending laterally across said plank portion for substantially blocking open access into the communication port peripherally about said locking member when lockingly inserted therein; and,
    at least one support member extending from one of said locking and base members for limiting displacement of said plank portion toward said base member upon deflection of said locking member;
    wherein said engagement member is releasable from the locking position responsive to said spine member being severed to decouple said locking and base members from one another; and, said spine member is configured for residual deformation at an exposed end when severed.

15. The port protector as recited by claim 14, wherein said base, locking, and spine members are integrally formed to define a unitary body for insert into at least one of the communication ports.

16. The port protector as recited by claim 15, wherein at least a portion of said unitary body is formed with visual indicia pseudo-randomly configured in shape, size, and pattern of arrangement.

17. The port protector as recited by claim 16, wherein said unitary body is formed of a translucent thermoplastic material; and, said visual indicia includes a plurality of pseudo-randomly configured speckles embedded therein.

18. A port protector having unitary construction for self-locking insert into a communication port of electronic equipment, comprising:
    a base member defining a support surface extending longitudinally between outer and inner ends;
    a locking member deflectively coupled to said base member by a spine member extending transversely therebetween, said locking member having an anchored portion attached to said spine member and a plank portion projecting longitudinally inward therefrom to terminate at a free end, said plank portion extending over said support surface of said base member;
    an engagement member extending transversely from said plank portion of said locking member and configured for retentively engaging the communication port when disposed at a locking position therein;
    a shield member projecting transversely from said plank portion and extending laterally across said plank portion for substantially blocking open access into the communication port peripherally about said locking member when lockingly inserted therein;
    at least one support member extending from said locking member for limiting displacement of said plank portion toward said base member upon deflection of said locking member; and,
    a plurality of baffle members projecting from said plank portion transversely toward said base member, said baffle member having a substantially planar contour defining a terminal edge extending laterally across said base member, said baffle member being configured for residual deformation along said terminal edge upon tampering contact of an intrusive instrument;
    wherein said base, locking, and spine members are integrally formed to define a unitary body for insert into at least one of the communication ports with said spine member being disposed adjacent said outer end of said base member; and, said engagement member is releasable from the locking position responsive to said spine member being severed to decouple said locking and base members from one another.

19. The port protector as recited by claim 18, wherein said outer end of said base member, said spine member, and said anchored portion of said locking member collectively define a substantially I-shaped sectional profile; said unitary body is formed of a thermoplastic material; and, said spine member is configured for residual deformation at an exposed end when severed.

20. The port protector as recited by claim 18, wherein said unitary body and said engagement member are together configured for locking insert into a communication port of Small Form-factor Pluggable (SFP) type; and, at least a part of said unitary body is formed with visual indicia pseudo-randomly configured to define an apparent fingerprint for the port protector.

* * * * *